(12) United States Patent
Lu et al.

(10) Patent No.: US 10,114,041 B2
(45) Date of Patent: Oct. 30, 2018

(54) GROUND LOOP REDUCTION APPARATUS

(71) Applicant: Ford Global Technologies, LLC, Dearborn, MI (US)

(72) Inventors: Xi Lu, Northville, MI (US); Krishna Prasad Bhat, Belleville, MI (US); Chingchi Chen, Ann Arbor, MI (US); Mark Allan Lippman, New Baltimore, MI (US); Zhuxian Xu, Novi, MI (US); Guangyin Lei, Dearborn Heights, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 53 days.

(21) Appl. No.: 15/471,485

(22) Filed: Mar. 28, 2017

(65) Prior Publication Data
US 2018/0284154 A1    Oct. 4, 2018

(51) Int. Cl.
*G01R 1/04* (2006.01)
*G01R 1/073* (2006.01)

(52) U.S. Cl.
CPC .......... *G01R 1/07307* (2013.01); *G01R 1/04* (2013.01)

(58) Field of Classification Search
CPC . G01R 1/07307; G01R 1/0466; G01R 1/0483
See application file for complete search history.

(56) References Cited

U.S. PATENT DOCUMENTS

| 5,485,029 | A | * | 1/1996 | Crabbe | ............... | H01L 27/0623 |
|---|---|---|---|---|---|---|
| | | | | | | 257/347 |
| 2006/0189212 | A1 | * | 8/2006 | Avery | .................. | H01R 12/724 |
| | | | | | | 439/607.05 |
| 2009/0212798 | A1 | * | 8/2009 | Kasukabe | .......... | G01R 1/06727 |
| | | | | | | 324/754.07 |
| 2013/0253296 | A1 | | 9/2013 | Prass | | |

* cited by examiner

*Primary Examiner* — Jermele M Hollington
*Assistant Examiner* — Alvaro Fortich
(74) *Attorney, Agent, or Firm* — Brooks Kushman P.C.

(57) ABSTRACT

A voltage probe holster includes a support member disposed on a base. The support member defines a plurality of apertures sized to receive a plurality of single-ended probes having coaxial leads. Each of the apertures have a conductive periphery configured to conduct electricity from one of the coaxial leads such that a common ground loop through the support member and the base is formed and that differences in ground potential are reduced.

20 Claims, 2 Drawing Sheets

GROUND LOOP REDUCTION APPARATUS

TECHNICAL FIELD

This disclosure relates to ground loop reduction for multiple probe testing configurations.

BACKGROUND

Electric machines may be driven by inverters having a plurality of solid-state switching devices. Measurement of a switching device's performance requires multiple voltage probes attached to predetermined locations on the switching device. Some of the probes are used to measure small voltages. The effect of ground loops can influence the measurement accuracy of small voltages. Ground loops may increase measurement errors and impose ambiguity among the voltage measurements.

SUMMARY

A voltage probe holster includes a support member disposed on a base. The support member defines a plurality of apertures sized to receive a plurality of single-ended probes having coaxial leads. Each of the apertures have a conductive periphery configured to conduct electricity from one of the coaxial leads such that a common ground loop through the support member and the base is formed and that differences in ground potential are reduced.

The holster may include test jacks retained by the apertures interconnecting the one of the coaxial leads to the support member. The test jacks may be secured by nuts and an interference fit with the one of the coaxial leads. At least a portion of the member may be perpendicular to the base. The support member and base may be copper. As such, the support member may be brazed to the base. The base and support member may be gold-plated. Additionally, the base and support member may be unitary.

A voltage probe holster includes a conductive base. The holster includes a gold-plated support member brazed to the base. The support member defines a plurality of apertures sized to receive a plurality of single-ended probes having coaxial leads. Each of the apertures have a conductive periphery configured to conduct electricity from one of the coaxial leads such that a common ground loop through the support member and the base is formed and that differences in ground potential are reduced.

The test jacks may be retained by the apertures thereby interconnecting the one of the coaxial leads to the support member. The test jacks may be secured by nuts and interference fit with the one of the coaxial leads. A portion of the member may be perpendicular to the base.

A voltage probe holster includes a ground plate. The holster includes a nonconductive support member coupled to the base. The support member defines a plurality of probe apertures sized to receive a plurality of single-ended probes having coaxial leads. Each of the apertures have a conductive periphery configured to conduct electricity from one of the coaxial leads. Each conductive periphery being connected by at least one conductive path disposed on the support member such that a common ground loop through the support member is formed and that differences in ground potential are reduced.

The ground plate may define a ground aperture sized to receive a ground pin of a power module. A portion of the member may be perpendicular to the base. The holster may include test jacks retained by the apertures interconnecting the one of the coaxial leads to the support member. The test jacks may be secured by nuts and interference fit with the one of the coaxial leads.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Ground loops form when ground connections of a circuit have different potentials. Different potentials may be formed by induction, capacitive coupling, or intrinsic conductor resistance. As the difference in ground potentials increases, accurate measurement of sensitive equipment voltages is impeded. For example, measurement of semiconductor devices used to invert direct current to alternating current may be impeded by ground loops.

Semiconductors used in inverters (e.g., IGBTs) have multiple test points located internally and externally. To establish a relationship between these points, different reference points or ground potentials are utilized. Variance among reference or ground potentials increases measurement error and decreases accuracy when passive probes are used. Passive probes may include resistors and capacitors, which is distinguished from active probes that include operational amplifiers. A voltage probe holster may minimize ground loops and provide structural support for the voltage probes. Variance may be reduced by minimizing the distance between ground connections to reduce the ground loops caused by intrinsic resistances in the conductors and ambient electromagnetic fields. Additionally, noise is increased as switching frequency of the associated IGBT increases, which further requires variance to be minimized.

Figure 1:
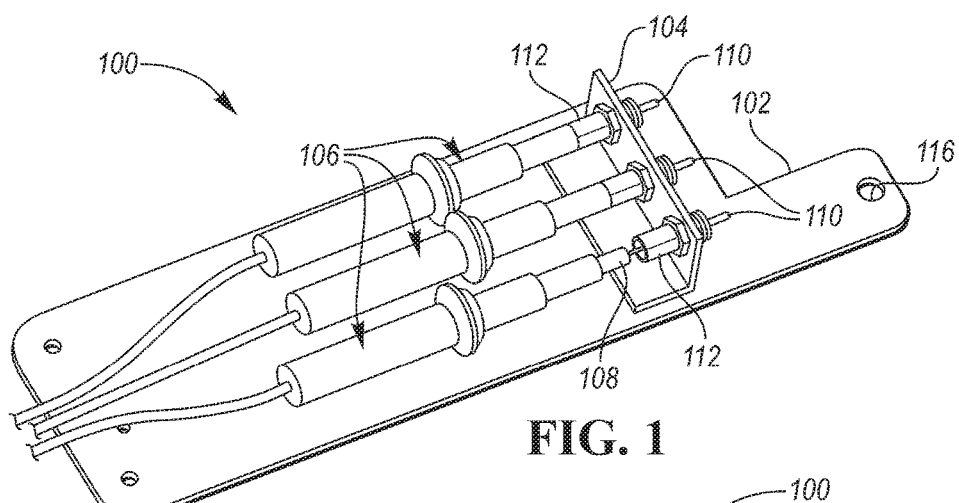
FIG. 1 is an isometric view of a voltage probe holster.

Referring to FIG. 1, a voltage probe holster 100 is shown. The voltage probe holster 100 includes a base or ground plate 102. The plate 102 may be attached to a power module through termination hole 116. The plate may be attached or connected with a support member 104. The support member 104 may be L-shaped. The member 104 and the plate 102 may be a unitary piece. The plate 102 and member 104 may be connected through brazing or another fastening method. The member 104 is brazed to the plate 102 to reduce contact resistance between the plate 102 and the member 104. In sensitive measurements, reduced contact resistances in the ground loop decrease the noise influence of the measurement.

The conductive portions of the member 104 and plate 102 may be copper or another conductor. The member 104 and the plate 102 may be gold-plated to further reduce contact resistances. The member 102 and plate 104 may have a thickness greater than a predetermined value to ensure the thickness does not impose additional resistance. It should be appreciated that conductor refers to any conductive material typically used to conduct electricity. For example, copper, which has a resistivity of $1.68 \times 10^{-8}$ is commonly used as a conductor. Any material having a resistivity less than $1.00 \times 10^{-6}$ may be considered a conductor for the purposes of this application.

As shown, the member 104 supports a plurality of single-ended voltage probes 106. A single-ended probe may be a single probe having two connections. Sometimes, the probes 106 are referred to as passive probes. Although shown as unitary, the probes may have two distinct leads. The probes 106 include a coaxial pair of conductors or leads 108, 110. The outer housing of the probe is typically the ground lead 108, which protects the probe lead 110. Test jacks 112 may be secured to the support member 104 through nuts 114. The test jacks 112 may provide an interference connection between the probe 106 and the holster 100, securing the probe 106 to the holster 100 and providing an electrical connection to the support member 104. In some embodiments, the ground lead 108 of the probe 106 may be connected directly to the support member 104.

Figure 2:
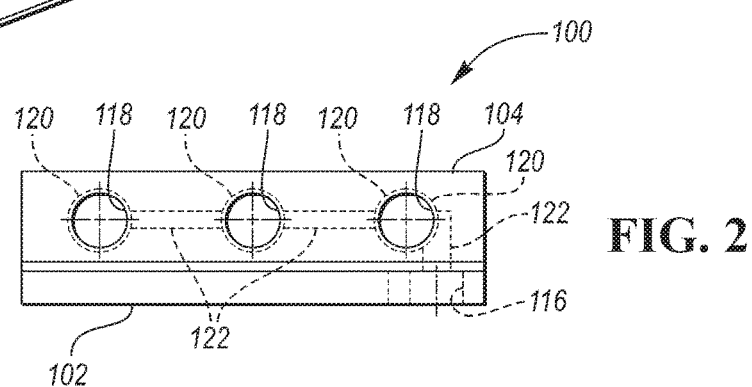
FIG. 2 is a front view of a voltage probe holster having conductive peripheries and conductive paths.

Referring to FIG. 2, a holster 100 is shown. The holster 100 has a plurality of apertures 118 sized to receive the probes 106, as shown in FIG. 1. The apertures 118 may also be sized to retain the probes 106. The probes 106 may connect directly to the apertures 118 or be connected through test jacks 112. In other embodiments, the test jacks 112 may be brazed to the support member 104. The test jacks 112 may include a reference or ground portion 124 brazed to the support member 104, which include an interference fit with the ground lead 108. The ground portion 124 may be stamped or formed from the material removed to create the apertures 118. The test jacks 112 may include an insulator 126 to separate the ground portion 124 from a test lead portion 128. Both the ground portion 124 and test lead portion 128 may have an interference fit with respective leads 108, 110. The test lead 110 may be routed as close to the ground plate 102 as possible long a route to the IGBTs. The apertures 118 define a conductive outer periphery 120. The conductive outer peripheries 120 may be connected by conductive wires 122. The conductive wires 122 may extend all the way to the power module termination 116 of the plate 102.

In other embodiments, the entire support member 104 may be conductive. The path of least resistance through the support member 104 (e.g., a straight line) would ensure that ground loops are minimized without specific wires 122. The apertures 118 may be any size and shape. The apertures 118 may be noncircular and have contact areas located on the respective peripheries 120. The support member 104 may be perpendicular to the plate 102 because the center pin of the passive probe 106 is very delicate. In order to not damage the pin, the passive probe 106 is preferred to be parallel to the plate 102. The support member 104 may form an obtuse or acute angle with the plate 102.

Figure 3:
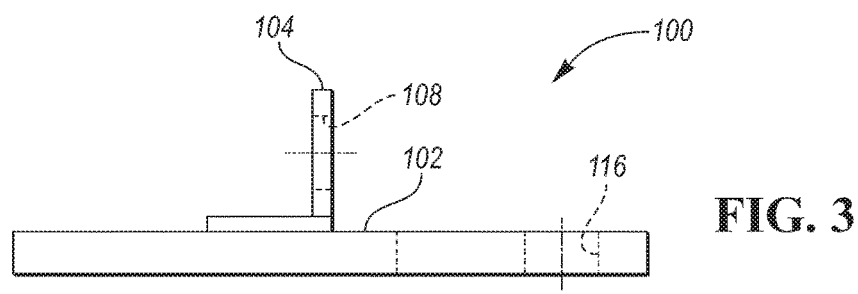
FIG. 3 is a side view of a voltage probe holster.
Figure 4:
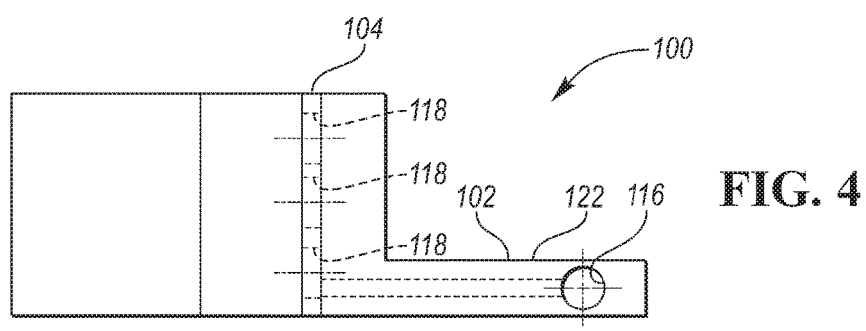
FIG. 4 is a top view of a voltage probe holster.
Figure 5:
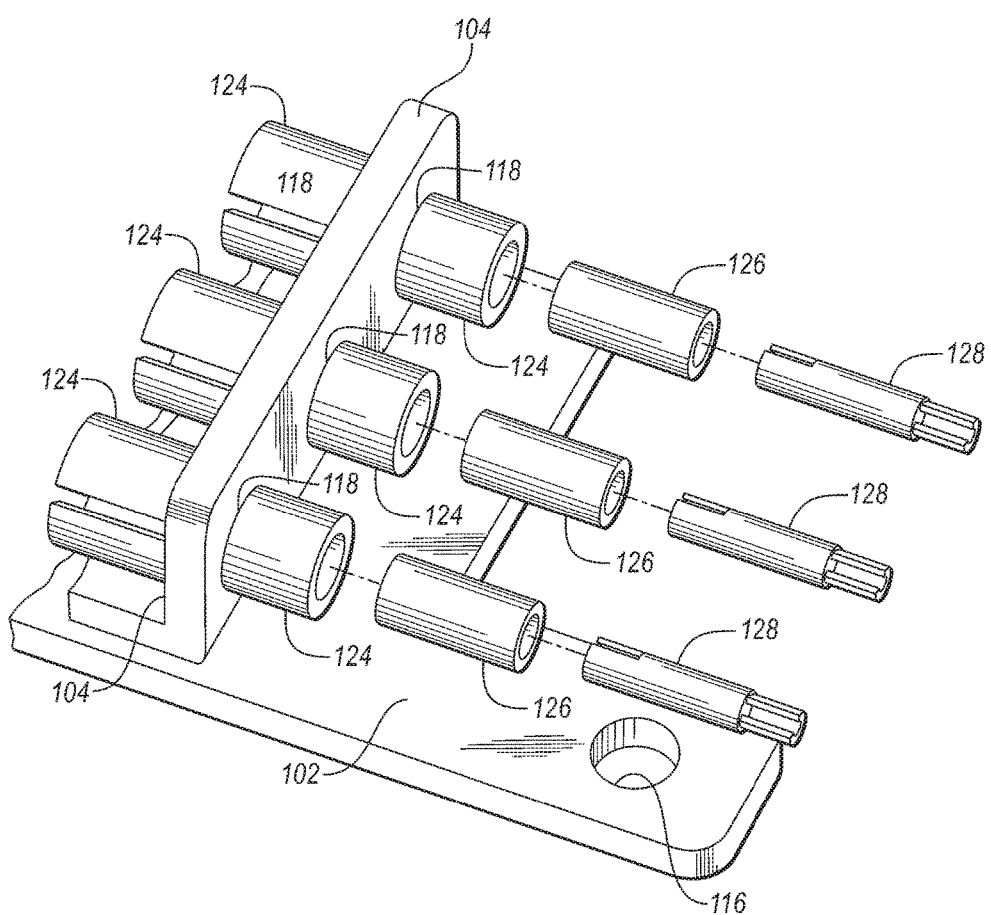
FIG. 5 is an isometric view of an exploded test jack and holster.

Referring to FIGS. 3 and 4, a holster 100 including an L-shaped support member 104 is shown having a plurality of apertures sized to receive or retain a voltage probe. The L-shaped support member 104 may be brazed to the base plate 102. Although brazing is preferred, the support member 104 may be welded, solder, screwed or otherwise connected with the plate 102. The support member 104 and the plate 102 may be unitary. Meaning, the support member 104 and the base plate 102 may be casted or molded. The base plate 102 may include a power module aperture 116 configured to connect with a power module terminal.

As shown, both sides of the single-ended probe are accessible to the user from one side of the base plate 104, providing ease of access for mounted base plates 102 that are accessible from either side of a wall or plane. Although shown in a straight line, the apertures 118 may be arranged in various geometric shapes to reduce the ground loop. For example, the apertures 118 may be arranged in a triangular fashion such that centroids of the apertures 118 form vertices of the triangle. In other embodiments having more than three apertures 118, the apertures 118 may form vertices of other geometric shapes. For example, four apertures 118 may form the vertices of a rectangle or square.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A voltage probe holster comprising:
   a support member disposed on a base and defining a plurality of apertures sized to receive a plurality of single-ended probes having coaxial leads, each of the apertures having a conductive periphery configured to conduct electricity from one of the coaxial leads such that a common ground loop through the support member and the base is formed and that differences in ground potential are reduced.

2. The holster of claim 1 further comprising test jacks retained by the apertures interconnecting the one of the coaxial leads to the support member.

3. The holster of claim 2, wherein the test jacks are secured by nuts and an interference fit with the one of the coaxial leads.

4. The holster of claim 2, wherein the test jacks and the one of the coaxial leads have an interference fit.

5. The holster of claim 1, wherein a portion of the support member is perpendicular to the base.

6. The holster of claim 1, wherein the support member and base are copper.

7. The holster of claim 6, wherein the support member is brazed to the base.

8. The holster of claim 6, wherein the base and support member are gold-plated.

9. The holster of claim 1, wherein the base and support member are unitary.

10. The holster of claim 1, wherein the apertures are only accessible from one side of the base.

11. The holster of claim 1, wherein the apertures are arranged in a line.

12. The holster of claim 1, wherein the apertures form vertices of a triangle.

13. A voltage probe holster comprising: a conductive base; and a gold-plated support member brazed to the conductive base and defining a plurality of apertures sized to receive a plurality of single-ended probes having coaxial leads, each of the apertures having a conductive periphery configured to conduct electricity from one of the coaxial leads such that a common ground loop through the support member and the base is formed and that differences in ground potential are reduced.

14. The holster of claim 13 further comprising test jacks retained by the apertures interconnecting the one of the coaxial leads to the support member.

15. The holster of claim 14, wherein the test jacks are secured by nuts and interference fit with the one of the coaxial leads.

16. The holster of claim 13, wherein a portion of the gold-plated support member is perpendicular to the base.

17. A voltage probe holster comprising: a ground plate; and a nonconductive support member coupled to the plate and defining a plurality of probe apertures sized to receive a plurality of single-ended probes having coaxial leads, each of the probe apertures having a conductive periphery configured to conduct electricity from one of the coaxial leads, each conductive periphery being connected by at least one conductive path disposed on the support member such that a common ground loop through the nonconductive support member is formed and that differences in ground potential are reduced.

18. The holster of claim 17, wherein the plate defines a ground aperture sized to receive a ground pin of a power module.

19. The holster of claim 17 further comprising test jacks retained by the probe apertures interconnecting the one of the coaxial leads to the nonconductive support member.

20. The holster of claim 19, wherein the test jacks are secured by nuts and interference fit with the one of the coaxial leads.

* * * * *